(12) United States Patent
Yanagita et al.

(10) Patent No.: US 7,612,432 B2
(45) Date of Patent: Nov. 3, 2009

(54) P-TYPE ZNS BASED SEMICONDUCTOR MATERIAL HAVING A LOW RESISTANCE DUE TO ITS HIGH COPPER CONTENT

(75) Inventors: Hiroaki Yanagita, Tokyo (JP); Hiroshi Kawazoe, Kanagawa (JP); Masahiro Orita, Tokyo (JP)

(73) Assignee: Hoya Corporation, Tokyo (JP)

( * ) Notice: Subject to any disclaimer, the term of this patent is extended or adjusted under 35 U.S.C. 154(b) by 258 days.

(21) Appl. No.: 10/588,659

(22) PCT Filed: Feb. 3, 2005

(86) PCT No.: PCT/JP2005/001596
§ 371 (c)(1),
(2), (4) Date: Aug. 7, 2006

(87) PCT Pub. No.: WO2005/076373
PCT Pub. Date: Aug. 18, 2005

(65) Prior Publication Data
US 2007/0181904 A1    Aug. 9, 2007

(30) Foreign Application Priority Data
Feb. 6, 2004    (JP)    ............... 2004-031086

(51) Int. Cl.
*H01L 29/22* (2006.01)
(52) U.S. Cl. ............ 257/614; 257/613; 257/103; 257/E33.022; 257/E33.02; 257/E33.019
(58) Field of Classification Search ......... 257/607–612, 257/55, 63, 614, 78, 103, 36, 613, E33.02, 257/E33.022, E33.019
See application file for complete search history.

(56) References Cited

U.S. PATENT DOCUMENTS 5,291,056 A * 3/1994 Howson .................. 257/442

(Continued)

FOREIGN PATENT DOCUMENTS

JP        63-220514 A        9/1988

(Continued)

OTHER PUBLICATIONS

V. Dimitrova, J. Tate, Synthesis and characterization of some ZnS-based thin film phosphors for electroluminescent device applications, Thin Solid Films 365 (2000) pp. 134-138.*

(Continued)

*Primary Examiner*—Phat X Cao
*Assistant Examiner*—Diana C Garrity
(74) *Attorney, Agent, or Firm*—Sughrue Mion, PLLC

(57) ABSTRACT

It is an object to provide a p-type ZnS based semiconductor material having a low resistance which can easily form an ohmic contact to a metallic material. Moreover, the invention provides a semiconductor device and a semiconductor light emitting device which include an electrode having a low resistance on a substrate other than a single crystal substrate, for example, a glass substrate.

The semiconductor material according to the invention is used as a hole injecting electrode layer of a light emitting device and has a transparent property in a visible region which is expressed in a composition formula of $Zn_{(1-\alpha-\beta-\gamma)}Cu_\alpha Mg_\beta Cd_\gamma S_{(1-x-y)}Se_x Te_y$ ($0.004 \leq \alpha \leq 0.4$, $\beta \leq 0.2$, $\gamma \leq 0.2$, $0 \leq x \leq 1$, $0 \leq y \leq 0.2$, and $x+y \leq 1$).

28 Claims, 11 Drawing Sheets

U.S. PATENT DOCUMENTS

| | | | |
|---|---|---|---|
| 5,574,296 A | 11/1996 | Park et al. | |
| 6,072,198 A * | 6/2000 | Sun et al. | 257/103 |
| 2006/0261487 A1 * | 11/2006 | Kawazoe | 257/762 |

FOREIGN PATENT DOCUMENTS

| | | |
|---|---|---|
| JP | 10-233554 A | 9/1998 |
| JP | 3078611 | 6/2000 |
| JP | 2001-226200 A | 8/2001 |
| JP | 2002-289917 A | 10/2002 |
| JP | 2002-373459 A | 12/2002 |
| JP | 2003-137700 A | 5/2003 |
| JP | 2004-043656 A | 2/2004 |

OTHER PUBLICATIONS

W. Faschinger; "Doping and contacting of wide gap II-VI compounds"; Journal of Crystal Growth; vol. 197; 1999; pp. 557-564.

K. Katayama, et al.; "ZnSe-based white LEDs"; Journal of Crystal Growth; vol. 214/215; 2000; pp. 1064-1070.

Masafumi Yamaguchi et al., "Behavior of Copper Impurity in ZnSe", Japanese Journal of Applied Physics, vol. 17, No. 2, pp. 335-340 (Feb. 2, 1978).

"Optophysical Property Handbook" (1984); pp. 182-185.

Japanese Office Action dated Jun. 11, 2008.

* cited by examiner

P-TYPE ZNS BASED SEMICONDUCTOR MATERIAL HAVING A LOW RESISTANCE DUE TO ITS HIGH COPPER CONTENT

TECHNICAL FIELD

The present invention relates to a semiconductor material and a semiconductor device using the same, and more particularly to a transparent p-type semiconductor having a low resistance which is formed of ZnSe or ZnS or these mixed crystal and can easily form an ohmic contact to an electrode, and a semiconductor device and a semiconductor light emitting device which use the same.

BACKGROUND ART

ZnS and ZnSe semiconductors have band gaps of approximately 3.7 eV and 2.7 eV respectively where attention has been given to them as so-called wide gap semiconductors with being developed vigorously as optoelectronics light emitting materials having colors ranging from blue to green (a compound semiconductor containing the ZnS and ZnSe semiconductors as main components will be hereinafter referred to as a ZnS type semiconductor).

The semiconductors of this type with an n type can be fabricated relatively easily, however, it is hard to have a low resistance with a p type. For this reason, various technical developments have been attempted. A technique using nitrogen (N) as a dopant has been utilized for causing ZnSe to have the p type. As described in Patent Document 1, this is a technique for simultaneously irradiating a nitrogen (N) radical to a film and introducing N into the lattice to obtain p-ZnSe during the formation of said film through an epitaxial growth using an MBE (molecular beam epitaxy) method in which a single crystal of ZnSe or GaAs is employed as a substrate. The MBE method is a film forming technique in which a high degree of vacuum is indispensable, and a radical source controlled precisely is indispensable to the efficient generation of the N radical. For these reasons, there has been an industrial problem in its productivity Moreover, it has been reported that the upper limit of a carrier concentration of ZnSe based on N is $10^{18}$ $cm^{-3}$ (Non-Patent Document 1). Therefore, a resistivity is somehow still insufficient for an application to a unit, and a material having a lower resistance and an excellent p-type semiconductor characteristic has been desired under present conditions.

Moreover, there is a problem in that it is impossible to form an ohmic contact by using an electrode metal because the carrier concentration of the p-ZnSe is not sufficiently high under the present conditions. For this reason, conventionally, there has been employed a technique for forming a multi-quantum well (MQW) structure using ZnTe which can easily form a p type and a low resistance between an electrode metal and p-ZnSe. However, there is another problem in that a lattice defect is increased during an operation by the generation of Joule heat in this structure and an electrical resistance is thus increased to cause a deterioration in a unit (Non-Patent Document 2). Since the ZnTe is a substance having a band gap of 2.3 eV, therefore, it has a great light absorption for a light having a wavelength of 540 nm or less. For this reason, there is a problem in that a high extraction efficiency (light emission efficiency) cannot be expected in a light emitting device for emitting a light in a shorter wavelength than the wavelength region.

ZnS is a material which has a lower valence band top energy than ZnSe and is harder to have a p-type low resistance than ZnSe. A stable fabricating technique for obtaining p-ZnS has not been developed yet. For this reason, a resistivity can be reduced to $10^2$ Ωcm at most and is entirely insufficient for a unit application under the present conditions.

Conventionally, it has been reported that deep acceptor levels of approximately 1250 meV and 650 meV are formed respectively when Cu is doped to ZnS and ZnSe (Non-Patent Document 3). It has not been scrutinized yet that these materials are caused to have a low resistance by the dopant of Cu. A thermal energy at a room temperature is approximately 26 meV. For this reason, the activation of a carrier from such a great level cannot be expected at all.

In the situations described above, a Cu dopant concentration being conventionally scrutinized is $10^{19}$ $cm^{-3}$ (corresponding to 0.05 at % or α=approximately 0.001) at most. It has been known that Cu forms a deep acceptor level in ZnS and ZnSe as described above. An activation ratio of a carrier estimated from the acceptor level position (a ratio of a carrier concentration to an doped Cu concentration) is $10^{-5}$ at most or less than that at a room temperature. For example, a carrier concentration obtained in the case in which Cu is doped in a concentration of $10^{19}$ $cm^{-3}$ (corresponding to 0.05 at % or α=approximately 0.001) is $10^{14}$ $cm^{-3}$, and a carrier concentration which is obtained is estimated to be $10^{16}$ $cm^{-3}$ at most even if Cu is doped in a concentration of $10^{21}$ $cm^3$ (corresponding to 5 at % or α=approximately 0.1). Therefore, it has been supposed that a practical electrical characteristic cannot be obtained at all.

In recent years, moreover, the formation of a unit on a glass substrate or a plastic substrate has been an important issue in the field of a semiconductor light emitting device. Correspondingly, the application of an amorphous phase or a polycrystalline phase has also been required for an electrode layer and an active layer. However, a conventional ZnS based p-type semiconductor material has been indispensable to be a single crystal material or an epitaxial growth film. In particular, a single crystal of ZnS or ZnSe has been used as a homoepitaxial substrate, and a single crystal of GaAs or Si having a similar crystal structure and a small difference in a lattice constant has been used as a heteroepitaxial substrate. A high temperature of 300° C. or more has been required for the temperature of a substrate in the formation of these epitaxial growth films. These are requirements for fabricating an epitaxial film having few defects and high quality. More specifically, the characteristic of a p-type semiconductor has been first obtained for a single crystal having few defects and high quality. For this reason, it is necessary to raise a film forming temperature. On the other hand, in the case in which these materials are set to be a polycrystalline phase or an amorphous phase, a lattice defect generated in a grain boundary or a lattice defect induced to a lattice strain is introduced. As a result, there is caused a hindrance that a carrier is trapped into these lattice defects. For this reason, the activation of a dopant is suppressed so that it is impossible to obtain a low resistance material which is excellent. In such a situation, there has not been made a trial of utilizing the ZnS based p-type semiconductor material in a configuration other than the single crystal or the epitaxial film.

Patent Document 1: JP Patent No. 3078611 (Patentee Minnesota Mining & Manufacturing, University of Florida), also published as JP 4-234136.

Non-Patent Document 1: Journal of Crystal Growth, vol. 197(1999), pp. 557-564/W. Faschinger.

Non-Patent Document 2: Journal of Crystal Growth, vol. 214/215(2000), pp. 1064-70/A. Katayama et al.

Non-Patent Document 3: Optophysical Property Handbook (Asakura Bookstore, 1984) pp. 182-185.

DISCLOSURE OF THE INVENTION

Problems to be Solved

Under the circumstances, a p-type low resistance has not been implemented by the dopant of Cu as an additive to a ZnS based semiconductor such as ZnS or ZnSe. A Cu dopant concentration which has conventionally been scrutinized is $10^{19}$ cm$^{-3}$ at most (corresponding to 0.05 at % or $\alpha$=approximately 0.001). In such a situation, as described above, there has been the following background, that is, 1. there has been known that Cu forms a deep acceptor level in the initial stage of a development, and 2. there has been known a so-called luminance saturation in which a light emission efficiency is considerably deteriorated at a Cu dopant concentration of 0.01 at % or more in ZnS having Cu doped thereto, and a region having a higher Cu concentration has not been interesting as an optoelectronics material.

In the above situation, an electrical characteristic in a higher Cu concentration region has not been scrutinized in these materials, and it is very hard to obtain a p-type semiconductor having a low resistance, particularly, a p-type ZnS based semiconductor having a low resistance in such a manner that it can be used as an electrode.

In consideration of the actual circumstances, it is an object of the invention to provide a p-type ZnS based semiconductor material having a low resistance which can easily be fabricated and can readily form an ohmic contact to a metallic material.

Moreover, it is an object of the invention to provide a semiconductor device and a semiconductor light emitting device which include an electrode having a low resistance on a substrate other than a single crystal substrate, for example, a glass substrate.

Means for Solving the Problems

In order to solve the problems, a semiconductor material according to the invention is formed by a Cu doped p-type ZnS based semiconductor material.

In the semiconductor material according to the invention, moreover, the ZnS based semiconductor material includes a semiconductor material expressed in a composition formula of $(Zn_{1-\alpha-\beta-\gamma}Cu_\alpha A_\beta B_\gamma S_{1-x-y}Se_x Te_y)$ ($0.004 \leq \alpha \leq 0.4$, $\beta \leq 0.2$, $\gamma \leq 0.2$, $0 \leq x \leq 1$, $0 \leq y \leq 0.2$, and $x+y \leq 1$, A and B are elements selected from Cd, Hg and alkaline earth metals).

Furthermore, the semiconductor material according to the invention includes the semiconductor material having the composition formula in which A is Mg and B is Cd.

A semiconductor material may be ZnS, ZnSe or these mixed crystal material. The essence of the invention is as follows. More specifically, it has been found that a large amount of Cu is doped to ZnS, ZnSe or these mixed crystal which has conventionally been impossible. Consequently, it is possible to form a p-type semiconductor having a low resistance which cannot be estimated in the conventional art.

The inventors found that a ZnS based material is changed into the p-type semiconductor having a low resistance when a Cu dopant concentration $\alpha$ is set to be 0.004 to 0.4 (0.2 to 20 at %). A material subjected to such a dopant exhibits a p-type low resistance semiconductor characteristic having a volume resistivity of 10 $\Omega$cm or less also in a single crystal, polycrystal or amorphous phase. Moreover, a strong absorption is not generated in a visible region. For this reason, a transparent property is rarely changed in a base material which is used, that is, a ZnS based material which is not doped with Cu. There has not been found a ZnS based material which has a transparent property in a visible region and is a polycrystal, and has a low resistivity. The details of the reason why such characteristics are obtained are unknown. However, it can be supposed that a distance between Cu and Cu is reduced by an increase in a Cu concentration and an interaction is thus generated between Cu and Cu to newly form an electron level in the vicinity of the top of a valence band of the ZnS based material. For this reason, it can be supposed that such electrical characteristics which are not found at all in a low concentration region are generated in a region having a high Cu concentration.

The semiconductor material according to the invention can easily form an ohmic contact to a metal having a large work function such as Au, Pt or Pd as well as a metal having a smaller work function such as Al or In.

The reason is that a carrier concentration is very high. Furthermore, it is possible to form an ohmic contact to ITO (Indium tin oxide), ZnO, $Ga_2O_3$ or $SnO_2$ which is a transparent conductor. Conventionally, there has been employed a technique for forming a multiquantum well (MQW) structure using ZnTe which can easily have a p-type low resistance between an electrode metal and p-ZnSe in N-doped p-ZnSe (Non-Patent Document 1). On the other hand, the semiconductor material according to the invention has an excellent characteristic in that it is possible to easily form an ohmic contact to various wiring materials to be used generally as described above.

In addition to the single crystal phase, the polycrystalline phase or the amorphous phase has low resistance p-type electrical conducting characteristics. For this reason, it is not always necessary to use a film forming technique in an ultra-high vacuum such as MBE for fabrication. For example, it is also possible to carry out the fabrication by utilizing a simple evaporating apparatus (for example, a degree of vacuum of approximately $10^{-5}$ Torr), for example. Moreover, an epitaxial growth is not required. Therefore, a crystal structure and a lattice constant are not restricted in the selection of a substrate to be utilized as a film. Consequently, it is possible to carry out the fabrication over a single crystal substrate, a polycrystal substrate or a glass substrate having a different crystal structure and lattice constant. Moreover, the fabrication can also be carried out at a substrate temperature of approximately 150° C. or less. Therefore, it is also possible to utilize a plastic substrate formed by a material which is resistant to the temperature.

The Cu dopant concentration $\alpha$ is 0.004 to 0.4 (0.2 to 20 at %), and desirably, 0.02 to 0.24 (1 to 12 at %). When the Cu dopant concentration $\alpha$ is equal to or lower than 0.02 (1 at %), a resistivity tends to be slightly increased. In the case in which the Cu dopant concentration $\alpha$ is equal to or lower than 0.004 (0.2 at %), the resistivity is rapidly increased to $10^6$ $\Omega$cm or more and a utility is poor. When the Cu concentration $\alpha$ is higher than 0.24 (12 at %), a transparent property in a blue wavelength region tends to be slightly lowered. In the case in which the Cu dopant concentration $\alpha$ is higher than 0.3 (15 at %), it is supposed that Cu exceeds a solid solution limit to ZnS and ZnSe and another phase such as CuS, $Cu_2S$ or CuSe is generated in manufacture so that a homogeneous material cannot be obtained. In this case, moreover, the electrical characteristic of a low resistance p type can be held and CuS, $Cu_2S$ or CuSe has a great light absorption in a visible region so that there is a problem in that a transparent property in a visible light region cannot be obtained.

Furthermore, the transparent property in a substantially visible region is rarely changed in the base material which is used, that is, ZnS or ZnSe which is not doped with Cu, or a mixed crystal of these materials. In the case of an application to a semiconductor light emitting device in a visible region, therefore, a transparent property can be obtained by using the material for a hole injecting electrode. Consequently, the material is very excellent in that a high light extraction efficiency can be desired.

As in a conventional ZnS based semiconductor, other elements, that is, Mg, Cd, Ca or Hg in the form of Zn substitution and Te in the form of S and/or Se substitution can be introduced into the Cu doped p-type ZnS based semiconductor material according to the invention by setting approximately 20% as an upper limit. The essential features of the invention can be prevented from being damaged by the introduction of these elements. By the introduction of these elements, it is possible to regulate a resistivity, a band alignment, a transmission wavelength region and a refractive index. By the introduction of Mg, Cd, Ca or Hg, it is possible to bring a conduction band bottom energy position upward or downward. By the introduction of Te, it is possible to bring a valence band top energy position upward. In particular, an energy gap is increased by the introduction of Mg and a blue light transmittance is improved. Therefore, the material is useful for a blue light emitting device. Consequently, it is possible to form an excellent hetero structure in which a band alignment and a refractive index is regulated.

In the semiconductor material according to the invention, moreover, the semiconductor material contains at least one dopant selected from Cl, Br, I, Al, Ga and In as a compensation dopant and a concentration of the compensation dopant is $10^{17}$ to $10^{20}$ cm$^{-3}$ (corresponding to $5 \times 10^{-4}$ to 0.5 at %).

The details will be described in examples. As a result of our earnest studies, it has been found that the Cu doped ZnS based semiconductor material has a feature that a volume resistivity is changed very greatly within a range of approximately 10 $\Omega$cm to $10^{-1}$ $\Omega$cm with an increase in a Cu dopant concentration within a very small composition range of $\alpha$=0.004 to 0.01 (0.2 to 0.5 at %) and a change in the resistivity is very gentle with respect to a change in a composition in a region having a higher Cu dopant concentration as shown in FIG. 12.

For this reason, in some cases in which a desirable volume resistivity is to be obtained in approximately 10 to $10^{-1}$ $\Omega$cm, for example, a precise composition control is required, that is, $\alpha$ has a value of ±0.0005, a compensation dopant is further doped simultaneously to the Cu doped ZnS based semiconductor material to finely regulate a carrier concentration in place of the precise control of the Cu dopant concentration in order to obtain a desirable resistivity. The compensation dopant is at least one dopant selected from Cl, Br, I, Al, Ga and In and is constituted to have a compensation dopant concentration of $10^{17}$ to $10^{20}$ cm$^{-3}$. As is known in relation to the ZnS based semiconductor, these compensation dopants have a high activation ratio which is almost close to 1 in the concentration region. In the case in which the compensation dopant is not doped, a carrier concentration obtained in a region having a Cu dopant concentration $\alpha$=0.004 to 0.01 is in order of a little less than $10^{18}$ to $10^{20}$ cm$^{-3}$. For this reason, if a compensation dopant concentration for finely regulating the carrier concentration to have a desirable value is $10^{17}$ to $10^{20}$ cm$^{-3}$, the compensation dopant sufficiently satisfies a part for a fine regulation.

More specifically, in the semiconductor material according to the invention, it is possible to regulate a resistivity by using a compensation dopant (a compensator) in addition to a Cu doping amount. For the compensation dopant, it is possible to utilize Cl, Br, I, Al, Ga and In which has conventionally been used as an n-type dopant for the ZnS based semiconductor. The regulation of the resistivity is a technique which can be utilized for regulating a carrier balance and adjusting a hole— electron recombination position when a homojunction to an n-type or intrinsic ZnS based semiconductor and a heterojunction to another semiconductor material are formed to constitute a semiconductor device.

In the semiconductor material according to the invention, furthermore, the semiconductor material has a light absorption coefficient of $5 \times 10^5$ cm$^{-1}$ or less at 470 nm to 750 nm. By this structure, the semiconductor material can be effectively applied as a transparent semiconductor material in a visible region.

In the semiconductor material according to the invention, moreover, a volume resistivity of the semiconductor material is equal to or higher than $10^{-4}$ $\Omega$cm and is lower than $10^3$ $\Omega$cm.

By this structure, the semiconductor material can be applied, as a p-type semiconductor or a hole injecting electrode layer, to a semiconductor device.

In the semiconductor material according to the invention, furthermore, a carrier concentration of the semiconductor material is equal to or higher than $10^{16}$ cm$^{-3}$ and is lower than $10^{22}$ cm$^{-3}$.

By this structure, the semiconductor material can be effectively applied, as a p-type semiconductor or a hole injecting electrode layer, to a semiconductor device.

In the semiconductor device according to the invention, moreover, the semiconductor material is partially used. In the semiconductor device according to the invention, furthermore, the semiconductor material is used as a hole injecting electrode.

In the semiconductor device according to the invention, furthermore, the semiconductor device is a semiconductor light emitting device. The semiconductor material according to the invention is excellent in a transparent property in a visible region and is suitable for a material to be used in the semiconductor light emitting device.

In the semiconductor device according to the invention, moreover, the semiconductor material constitutes a hole injecting electrode layer in an amorphous phase or a polycrystal phase.

By this structure, the characteristics of the hole injecting electrode can be sufficiently obtained without a single crystal. Therefore, it is possible to fabricate the semiconductor device without a restriction on a substrate or a under-layer in the formation of a film. More specifically, glass and plastic can also be used as substrate materials, for example, and the selection range of the material of the semiconductor device can be increased greatly. Moreover, the glass or the plastic can be used as the substrate material. Consequently, it is also possible to manufacture a semiconductor device having a large area.

In addition, the semiconductor device according to the invention has a light emitting layer in an amorphous phase or a polycrystal phase.

By this structure, it is possible to obtain a semiconductor device which can easily be fabricated without a restriction on a substrate or a under-layer in the formation of a film.

Since the semiconductor material according to the invention has a low resistance, it serves as a functional layer such as a buffer layer provided between an electrode layer and an active layer in addition to the hole injecting electrode so that an efficient semiconductor device can be formed. The semiconductor device indicates various semiconductor device such as an LED, an LD, a solar cell and a sensor which have conventionally been known as techniques for applying the semiconductor material.

Moreover, there is no problem of a deterioration in a unit which is caused by the generation of Joule heat seen in a ZnSe/ZnTe MQW structure. Therefore, it is possible to obtain a unit which is excellent in a stable for a long period of time.

EFFECT OF THE INVENTION

The semiconductor material according to the invention is a p-type ZnS based semiconductor material having a transparent property and a low resistance and is a p-type semiconductor material which can easily be fabricated without selecting a substrate as a polycrystal material or an amorphous material without a limitation to a single crystal. Furthermore, there is provided a low resistance p-type ZnS based semiconductor material which is very effective for the hole injecting electrode material and can easily form an ohmic contact to a general wiring material. Moreover, there are provided a semiconductor device having a low resistance and a semiconductor light emitting device having a long lifetime which use the same semiconductor material.

Figure 1:
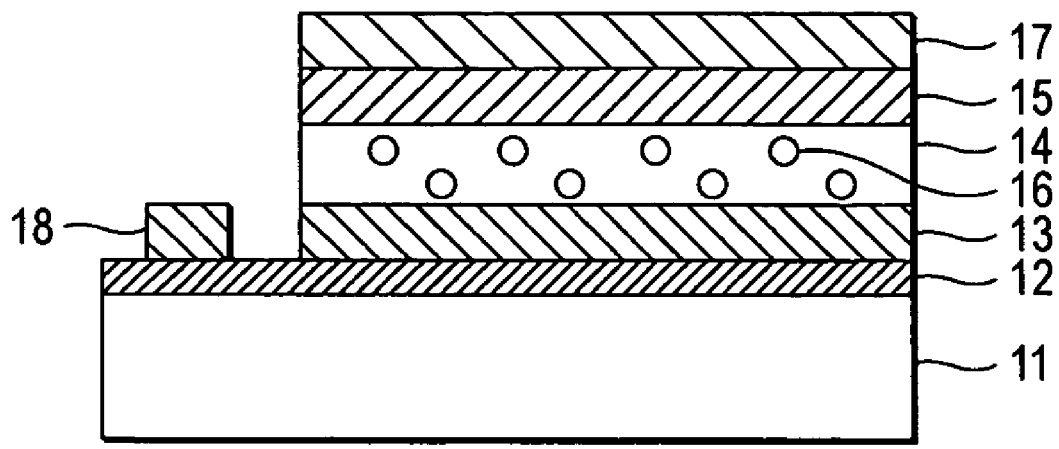
FIG. 1 is a view showing a semiconductor light emitting device according to a first embodiment of the invention.

EXPLANATION OF DESIGNATIONS 11 substrate
12 ITO
13 p-type electrode layer (hole injecting electrode layer)
14 light emitting layer
15 n-type electrode layer (electron injecting electrode layer)
16 nona-crystal
17 electrode layer
18 electrode
21 substrate
22 film formed by Cu doped p-type ZnS based semiconductor material
31 n-type ZnSe substrate
32 N-doped p-ZnSe layer
33 Cu doped p-type ZnSe layer
34 Au electrode
35 In electrode

BEST MODE FOR CARRYING OUT THE INVENTION

Embodiments of the invention will be described below.

First Embodiment

A light emitting diode is characterized in that a Cu doped ZnSe thin film is used as a hole injecting semiconductor layer (p-type semiconductor layer) 13 as shown in FIG. 1. More specifically, the light emitting diode is obtained by forming an ITO thin film 12 (a thickness of 300 nm) as a transparent electrode on a substrate 11 constituted by a non-alkali glass substrate, on which a Cu doped ZnSe thin film in a thickness of 300 nm is deposited, for example, as the hole injecting semiconductor layer (p-type semiconductor layer) 13, on which a ZnSe based amorphous semiconductor as a light emitting layer 14 (a thickness of 30 nm) is formed, where a nano-crystal colloid 16 with a core shell structure having InP as a nucleus and ZnSe as a shell is dispersed, and furthermore, depositing a polycrystalline thin film of an electron injecting semiconductor layer (n-type semiconductor layer) 15 (a thickness of 500 nm) having a conductivity on the light emitting layer.

According to this structure, a p-type semiconductor material constituting the hole injecting semiconductor layer is a transparent substance. Therefore, it is possible to implement a light emitting diode having a high light emission efficiency. For example, a Cu doped ZnSe thin film having a carrier concentration of $1 \times 10^{19}$ cm$^{-3}$ or more is suitable. An electrode 17 such as Al may be formed on the electron injecting semiconductor layer 15. An electrode 18 and the electrode layer 17 such as Al are formed on the ITO and the electron injecting semiconductor layer 15, and a power is supplied to the hole injecting semiconductor layer 13 by means of the electrode 18 such as Al which is formed on the ITO, while a power is supplied to the electron injecting semiconductor layer 15 by means of the electrode 17 such as Al.

Next, description will be given to a method of manufacturing the semiconductor light emitting device.

ZnSe was selected as a simultaneous bipolar semiconductor for forming the light emitting layer. A non-alkali glass substrate having an ITO thin film was introduced as the glass substrate 11 for forming a film into a molecular beam epitaxy (MBE) film forming vacuum device (manufactured by EIKO ENGINEERING CO., LTD, back pressure: $5 \times 10^{-10}$ Torr) and was held on a substrate holder (FIG. 2(A)).

Figure 2:
FIGS. 2(a) to 2(e) are the views showing a process for manufacturing the semiconductor light emitting device according to the first embodiment of the invention.
Figure 2:
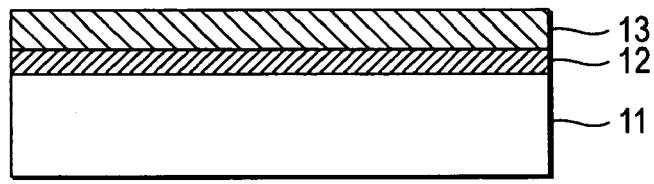
Figure 2:
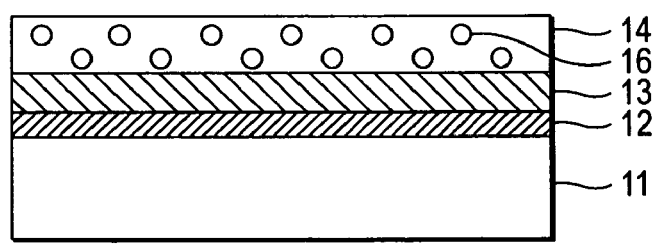
Figure 2:
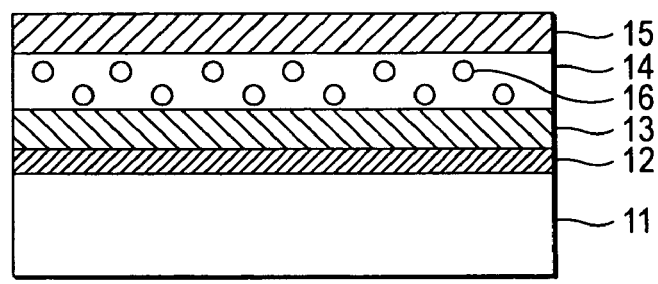
Figure 2:
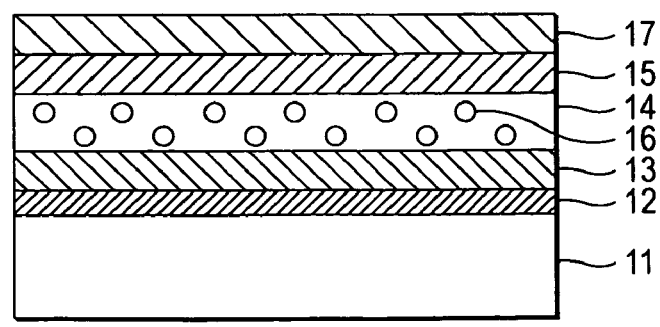

As shown in FIG. 2(b), next, the temperature of the substrate was raised to 300° C. and was left for 15 minutes. The molecular beam of each of components was effused from a Zn cell, an Se cell and a Cu cell, and a p-type semiconductor layer formed by a ZnSe polycrystalline thin film having a p-type by Cu doping was deposited in a thickness of 300 nm.

As shown in FIG. 2(c), subsequently, the molecular beam of each of components was discharged from the Zn cell, the Se cell and a cell filled with a third component to form a ZnSe based amorphous phase. At this time, a ZnSe coating InP nano-crystal dispersed in an organic solvent as the third component (a diameter of 2.5 nm, a ratio (CV value) of a particle size standard deviation to a particle size mean value of 10%) was simultaneously discharged as a molecular beam by an electrospray method and the three molecular beams were irradiated on the substrate together, and a ZnSe thin film having an InP nano-crystal dispersed therein was formed in a thickness of 30 nm.

As shown in FIG. 2(d), finally, the molecular beam of each of components was discharged from the Zn cell, the Se cell and a $ZnCl_2$ cell and a ZnSe thin film having an n type was deposited in a thickness of 500 nm.

As shown in FIG. 2(e), furthermore, the electrodes 17 and 18 which are constituted by Al were formed in a thickness of 50 nm by a heating evaporation method.

Figure 3:
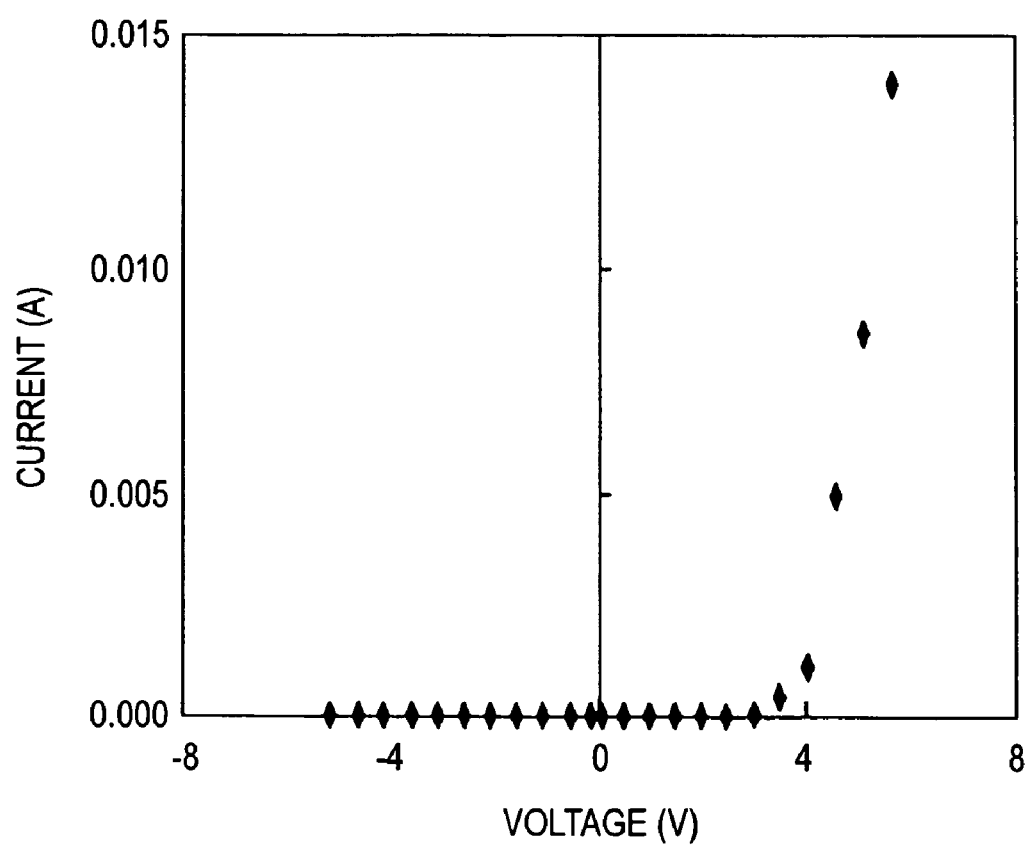
FIG. 3 is a chart showing a voltage-current curve of the semiconductor light emitting device according to the first embodiment of the invention.
Figure 4:
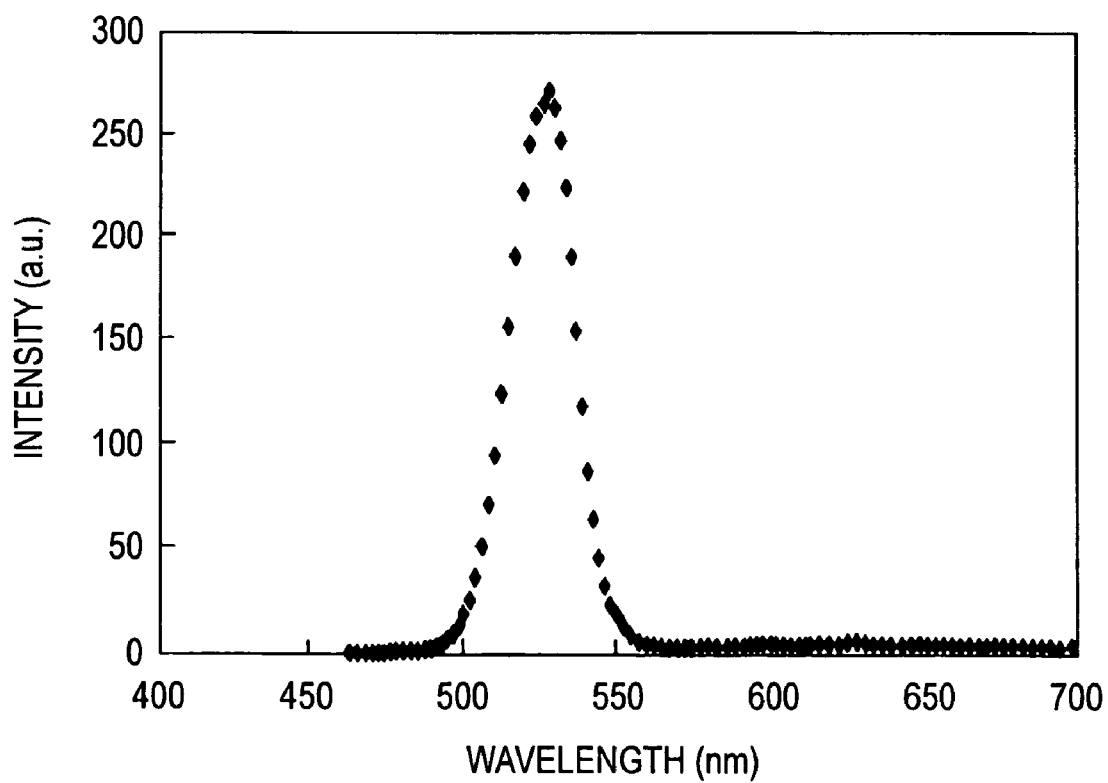
FIG. 4 is a chart showing a light emission spectrum of the semiconductor light emitting device according to the first embodiment of the invention.

When a voltage was applied between the electrode 17 and the electrode 18 in the light emitting diode shown in FIG. 1 thus formed, an excellent non-linear curve was obtained. A turn-on voltage corresponds to a forbidden band width of ZnSe to be a simultaneous bipolar semiconductor material in the vicinity of 3 V. Moreover, a wavelength of 525 nm has a sharp light emission (green) as shown in a voltage-current curve in FIG. 3 and a light emission spectrum in FIG. 4, and it was confirmed that the light emitting diode according to the invention effectively fulfils the function.

Second Embodiment

Next, description will be given to a second embodiment of the invention.

In the following embodiment, the property of a film will be subjected to an experiment and will be considered in detail.

Figure 5:
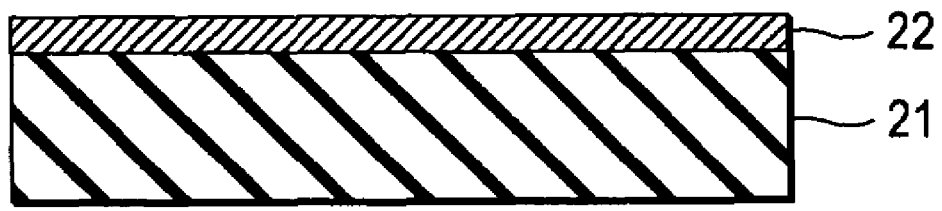
FIG. 5 is a view showing a semiconductor material according to a second embodiment of the invention.

By using each of high-purity raw materials (purity of 99.9999%) of Zn, Se and Cu, a film is formed on an insulating ZnSe substrate 21 (a volume resistivity of $10^8$ Ωcm or more, a surface orientation (111)) by a resistance heating type vacuum deposition apparatus as shown in FIG. 5. At this time, the temperature of each raw material is set to be 250° C., 150° C. and 1050° C. respectively, and at the same time, evaporation is carried out over the substrate 21 to deposit a film having a desirable composition. The film thus obtained is subjected to a post annealing treatment at 400° C. for 5 minutes in a nitrogen gas atmosphere by using a lamp heating furnace, thereby forming a film 22 having a thickness of 0.4 μm.

This film is observed by an X-ray diffraction method. Consequently, the same diffraction line as zincblende type ZnSe having a (111) orientation is obtained. By the confirmation of a composition through an ICP analysis, it is found that Zn, Cu and Se are contained in 45.5 at %, 4.5 at % and 50 at %. According to an SEM observation, moreover, these films are polycrystals having particle sizes of 1 to 5 μm.

The resistivity of this film is observed by a four probe method. As a result, the resistivity is 0.008 Ωcm which is very low. Moreover, the Seebeck effect electromotive force is observed. Consequently, it is confirmed that a negative electromotive force (approximately −0.1 mV) is obtained for a positive temperature difference (+5 degrees) and this film has a p-type conductivity. Two films for each of Au, Al and ITO are formed on this film by a sputtering method, and a current-voltage characteristic between electrodes (that is, between Au and Au, Al and Al, and ITO and ITO) is confirmed. Consequently, it is confirmed that an ohmic contact having no threshold voltage is formed in any case. Moreover, a light transmittance is confirmed. As a result, a remarkable absorption cannot be seen in at least 2.2 μm with a wavelength of 460 nm or more which is the absorption edge of the substrate, and a transmittance of 25% or more is obtained. An absorption coefficient is estimated to be $4 \times 10^4$ cm$^{-1}$ at a maximum.

Third Embodiment

Next, description will be given to a third embodiment of the invention.

Figure 6:
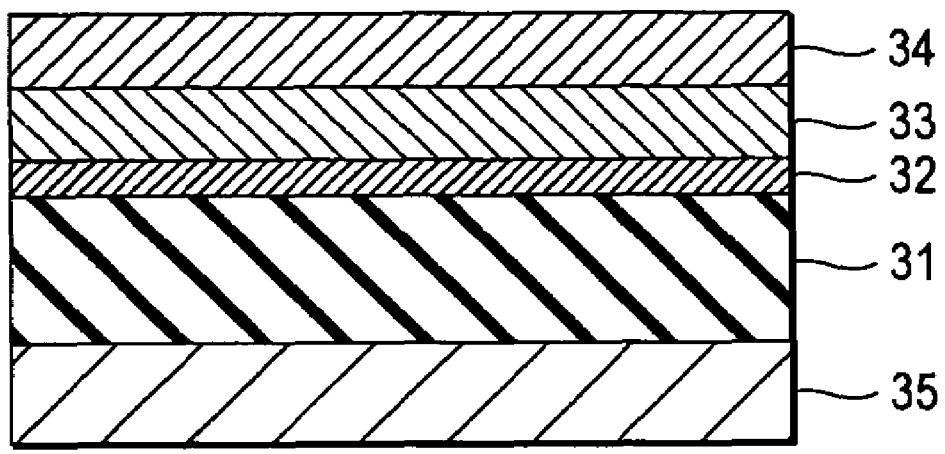
FIG. 6 is a view showing a semiconductor light emitting device according to a third embodiment of the invention.

As shown in FIG. 6, an n-type ZnSe substrate 31 (Ga doped, a volume resistivity which is equal to or lower than $10^{-1}$ Ωcm, surface orientation (111)) is used to form an N-doped p-ZnSe layer 32 (a carrier concentration of $2 \times 10^{17}$ cm$^{-3}$) in a thickness of approximately 1 μm on the substrate by an MBE method. In the same manner as in the second embodiment, Cu doped ZnSe is formed on this film by an evaporation and a p-type ZnSe layer 33 is formed to carry out post annealing. Furthermore, an Au electrode 34 having a diameter of 1 mm is attached in a thickness of approximately 100 nm to this film by a vacuum evaporation method.

Moreover, an electrode 35 formed of In is attached to the back face of the n-type ZnSe substrate 31 and a current-voltage characteristic between the Au electrode and the In electrode is observed. Consequently, it is possible to obtain a rectifying property in which a current rises at a forward bias of approximately 3V or more (the Au electrode is set to be a positive electrode). When a voltage which is equal to or higher than the forward bias is applied, moreover, it is possible to obtain a light emission having a peak wavelength of 465 nm and a light emission having a broad spectrum in a peak wavelength of 600 nm. Even if this device is driven for 1000 hours by a constant current operation of 20 mA, a decrease in a light emission intensity is not observed.

EXAMPLE

Examples 1 to 5

In order to form a semiconductor material according to the example of the invention, a film was formed by a resistance heating type vacuum evaporation on an insulating ZnSe substrate (a volume resistivity of $10^8$ Ωcm or more, a surface orientation (111)) by using each of high purity raw materials of Zn, Se and Cu (a purity of 99.9999%). The temperatures of the raw materials of Zn and Se were set to be 250° C. and 15° C. The temperature of the raw material of Cu was set to be 925 to 1100° C. These raw materials were evaporated on the substrate at the same time to deposit a film having a desirable composition. A Cu concentration (composition) obtained by a change in the temperature of the raw material of Cu was varied. The film thus obtained was subjected to a post annealing treatment at 400° C. for 5 minutes in a nitrogen gas atmosphere by using a lamp heating furnace so that a film having a thickness of 0.3 to 0.4 μm was obtained.

Figure 7:
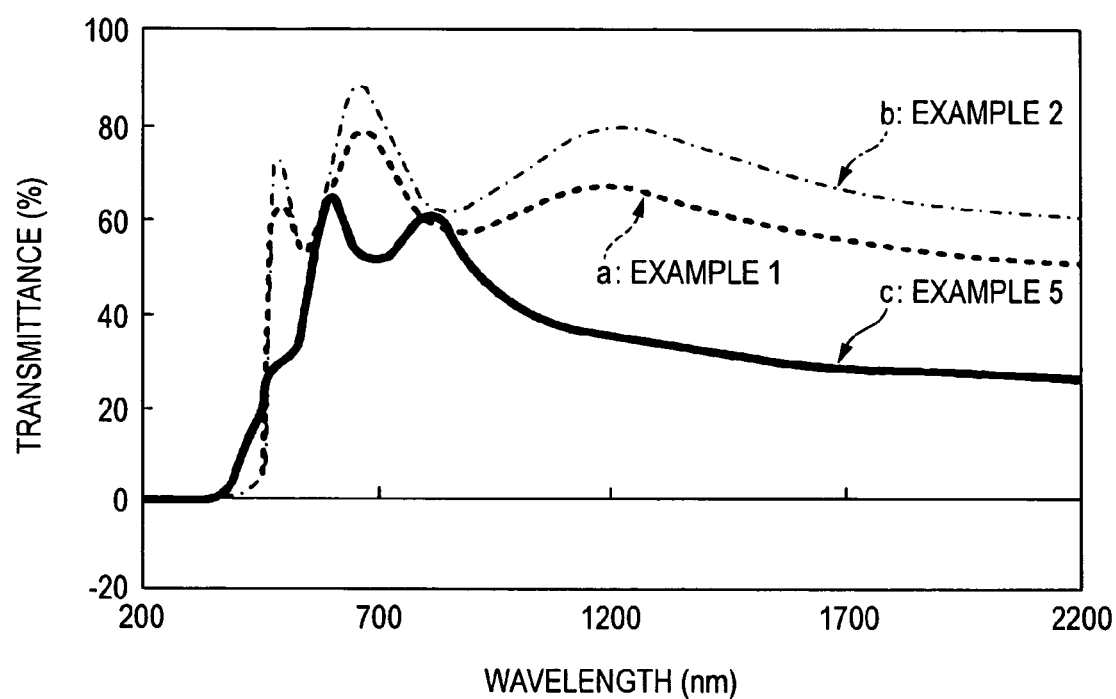
FIG. 7 is a chart showing a transmission spectrum of a semiconductor material according to an example 1, an example 2 and an example 5 of the invention.

This film was observed by an X-ray diffraction (XRD) method. Consequently, the same diffraction line as zincblende type ZnSe having an orientation (111) could be obtained. According to an SEM observation, these films were polycrystals having particle sizes of 1 to 5 μm. Moreover, the composition of this film was confirmed by an ICP analysis. Consequently, it was found that Zn, Se and Cu are contained in amounts shown in Table 1, respectively. For example, in the example 1, Zn, Se and Cu were 45.5 at %, 50.0 at % and 4.5 at % respectively. In the case in which this is expressed in a composition formula of $Zn_{(1-\alpha-\beta-\gamma)}Cu_{\alpha}A_{\beta}B_{\gamma}S_{(1-x-y)}Se_xTe_y$, α=0.99, β=γ=0, x=1 and y=0 are obtained. Compositions in other examples are also shown in the Table 1 in the same manner. When the temperature of the raw material is higher, the vapor pressure of the raw material is higher. As a result, the Cu concentration of the film which is obtained is increased. The resistivity of the film was observed by a four probe method. Consequently, it was found that the resistivity is 0.5 to 0.0008 Ωcm which is very low as shown in the Table 1. Moreover, the Seebeck effect electromotive force was observed. Consequently, it was confirmed that a negative electromotive force is obtained with respect to a positive temperature difference and the film has a p-type conductivity. Transparent characteristics in examples 1, 2 and 5 are shown in curves a, b and c in FIG. 7. A remarkable absorption could not be seen in at least 2.2 μm with a wavelength of 460 nm or more which is the absorption edge of the substrate, and a transmittance of 25% or more was obtained. An absorption coefficient was estimated to be $4 \times 10^4$ cm$^{-1}$ at a maximum in this wavelength region.

Figure 8:
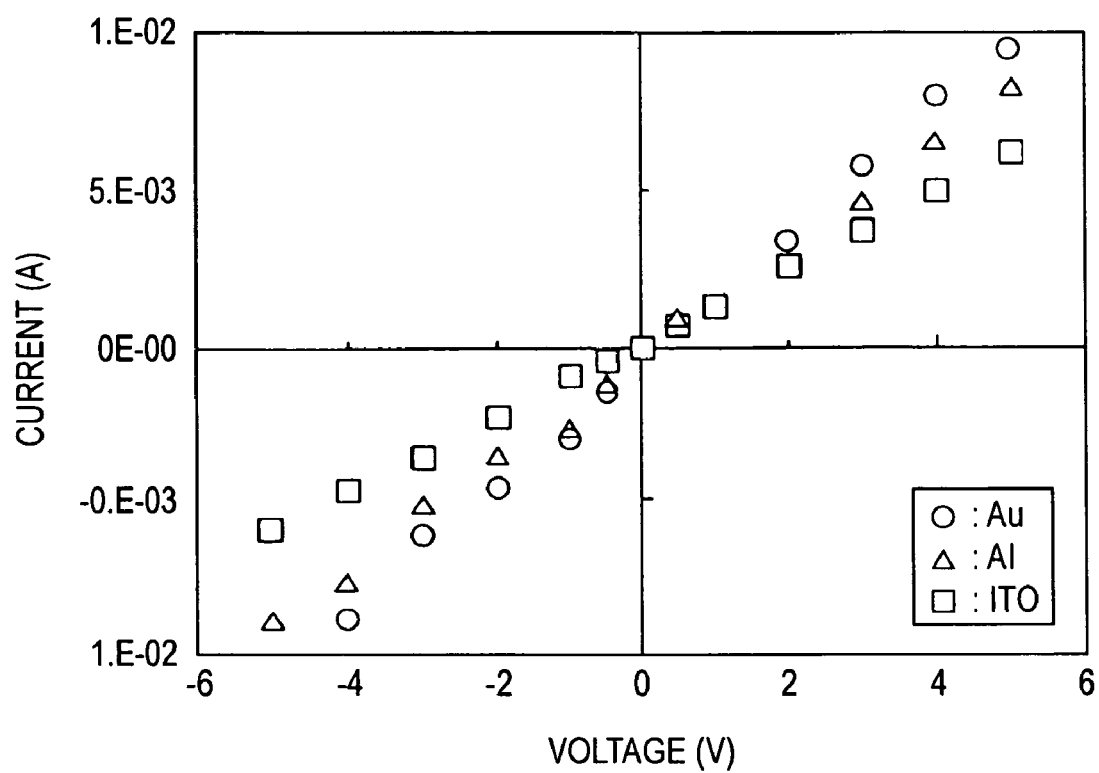
FIG. 8 is a chart showing a voltage-current curve of the semiconductor material according to the example 1 of the invention.

Two films for each of Au, Al and ITO (a diameter of 1 mm, an interval of approximately 5 mm and a thickness of approximately 100 nm) were formed on the film according to the example 1 by a sputtering method, and a current-voltage characteristic between electrodes (that is, between Au and Au, Al and Al, and ITO and ITO) was confirmed. Consequently, it was confirmed that an ohmic contact having no threshold voltage is formed as shown in FIG. 8 in any case.

In this example, the films of Au, Al and ITO were formed by the sputtering method. Also in the case in which they are formed by a conventionally general purpose film forming method, that is, a vacuum evaporation method or a pulse laser deposition method, the same results can be obtained. While the post annealing was carried out in the nitrogen atmosphere, moreover, the same results can be obtained even if it is executed in another inert gas atmosphere or a vacuum.

Comparative Examples 1 and 2

Example 29

A Cu doped ZnSe film having a thickness of 0.4 μm was obtained in the same manner as that in the example 1 except that the temperature of a Cu raw material was set to be 875° C. (comparative example 1), 900° C. (comparative example 2) and 1150° C. (example 29) to change a Cu concentration. According to an ICP analysis and an SIMS analysis (secondary ion mass spectrometry), the respective films had Cu concentrations shown in the Table 1. According to an SEM observation, these films according to the comparative example 1, the comparative example 2 and the example 29 were polycrystals having particle sizes of 1 to 5 μm. According to an XRD method analysis, the same diffraction line as zincblende type ZnSe having an orientation (111) was obtained from the films according to the comparative example 1 and the comparative example 2. Moreover, the Seebeck electromotive forces of the films according to the comparative example 1 and the comparative example 2 were measured. As a result, it was confirmed that this film is not a p-type semiconductor. It was found that a resistivity also has a very great value as shown in the Table 1. Moreover, a light transmittance according to each of the comparative example 1 and the comparative example 2 was observed. As a result, a remarkable absorption could not be seen in at least 2.2 μm with a wavelength of 460 nm or more and a transmittance of 35% or more was obtained. More specifically, an absorption coefficient in this wavelength region is estimated to be $3 \times 10^4$ cm$^{-1}$ at a maximum.

Moreover, it was found that the film according to the example 29 has a dark brown color and a great absorption is present in a visible region. According to the XRD method analysis, it was found that a diffraction line to be identified with CuSe and $Cu_{1.8}Se$ is obtained from the film according to the example 29 in addition to the same diffraction line as the zincblende type ZnSe having the (111) orientation, and the film is constituted by a ZnSe crystal phase and a CuSe and $Cu_{1.8}Se$ crystal phase. It has been known that CuSe and $Cu_{1.8}Se$ exhibit a low resistance p-type semiconductor characteristic. Referring to the film according to the example 29 which is formed of CuSe and $Cu_{1.8}Se$, the Seebeck electromotive force was measured. As a result, it was confirmed that this film has a p-type semiconductor characteristic. Furthermore, a resistivity also had a very small value of 0.0005 Ωcm as shown in the Table 1. More specifically, it was found that the film does not have a single phase and is hard to obtain a transparent property but has the characteristic of the p-type semiconductor with a very low resistance. Two films for each of Au, Al and ITO were formed on this film respectively by a sputtering method, and a current-voltage characteristic between electrodes was observed. Consequently, it was found that all of them form an ohmic contact. Therefore, the film is useful as long as the feature is utilized.

TABLE 1

| | Example 1 | Example 2 | Example 3 | Example 4 |
|---|---|---|---|---|
| Zn(at %) | 45.5 | 49.7 | 46 | 44 |
| Se(at %) | 50 | 60 | 50 | 50 |
| Cu(at %) | 4.5 | 0.3 | 2 | 5 |
| Total(at %) | 100 | 100 | 100 | 100 |
| α | 0.09 | 0.006 | 0.04 | 0.12 |
| β | 0 | 0 | 0 | 0 |
| γ | 0 | 0 | 0 | 0 |
| X | 1 | 1 | 1 | 1 |
| Y | 0 | 0 | 0 | 0 |
| Resistivity(Ω cm) | 0.008 | 0.5 | 0.15 | 0.02 |
| Carrier Concentration (cm − 3) | 2.00E+20 | 7.50E+19 | 1.20E+20 | 1.50E+20 |

| | Example 5 | Comparative Example 1 | Comparative Example 2 | Example 29 |
|---|---|---|---|---|
| Zn(at %) | 35 | 49.9 | 49.95 | 30 |
| Se(at %) | 50 | 50 | 50 | 50 |
| Cu(at %) | 15 | 0.1 | 0.05 | 20 |
| Total(at %) | 100 | 100 | 100 | 100 |
| α | 0.3 | 0.002 | 0.001 | 0.4 |
| β | 0 | 0 | 0 | 0 |
| γ | 0 | 0 | 0 | 0 |
| X | 1 | 1 | 1 | 1 |
| Y | 0 | 0 | 0 | 0 |
| Resistivity(Ω cm) | 0.0008 | 1000 | 10000 | 0.0004 |
| Carrier Concentration (cm − 3) | 3.00E+20 | 2.00E+17 | 1.00E+16 | 7.20E+20 |

Examples 6 to 10

Next, description will be given to examples 6 to 10 according to the invention.

A Cu doped ZnSe film was formed in the same manner as that in each of the examples 1 to 5 except that a non-alkali glass (manufactured by Corning Co., Ltd. #7059) was used as a substrate. According to an SEM observation, this film was a polycrystal having a particle size of 1 to 5 μm. By an observation carried out through an X-ray diffraction (XRD) method, the same diffraction line as zincblende type ZnSe having an orientation (111) was obtained from all of these films. A composition was confirmed by an ICP analysis. As a result, the content of Cu had a concentration (0.8 to 13 at %) which is almost equal to that in each of the examples 1 to 5 as shown in Table 2. For example, in the example 9, Zn, Se and Cu were 43.0 at %, 50.0 at % and 7.0 at %, respectively. In the case in which this is expressed in a composition formula of $Zn_{(1-\alpha-\beta-\gamma)}Cu_\alpha A_\beta B_\gamma S_{(1-x-y)}Se_x Te_y$, $\alpha=0.14$, $\beta=\gamma=0$, $x=1$ and $y=0$ are obtained. Compositions in other examples are also shown in the Table 2 in the same manner. Moreover, it was found that all of the films have a p-type conductivity by the Seebeck effect electromotive force. Furthermore, it was found that each of the films has a resistivity of 5 to 0.0015 Ωcm and has a low resistance. In addition, a transparent property was observed. As a result, a remarkable absorption could not be seen in at least 2.2 μm with a wavelength of 460 nm or more, and a transmittance of 25% or more was obtained. More specifically, an absorption coefficient in this wavelength region is estimated to be $5 \times 10^4$ cm$^{-1}$ at a maximum. In addition, two films for each of Au, Al and ITO were formed on the film by sputtering, and a current-voltage characteristic between electrodes was confirmed. Consequently, it was found that an ohmic contact is formed in any case.

confirmed that the film thus obtained is a p-type semiconductor by the Seebeck effect electromotive force. As shown in Table 3, a Cu concentration was 4.2 to 7 at % and an S concentration was set to be 20 to 50 at % (y=0.4 to 1, Z=0). For example, in the example 11, Zn, S, Se and Cu were 45.5 at %, 20.0 at %, 30.0 at % and 4.5 at %, respectively. In the case in which this is expressed in a composition formula of $Zn_{(1-\alpha-\beta-\gamma)}Cu_\alpha A_\beta B_\gamma S_{(1-x-y)}Se_x Te_y$, $\alpha=0.09$, $\beta=\gamma=0$, $x=0.6$ and $y=0$ are obtained. Compositions in other examples are also shown in the Table 3 in the same manner. Moreover, it was found that all of the films have a low resistivity of 5 to 0.05 Ωcm. According to an observation carried out through an XRD method, it was found that all of the films are formed of a zincblende type crystal having an orientation (111). Referring to the transmission spectrum of the film according to the example 15, moreover, a remarkable absorption could not be seen in at least 2.2 μm with a wavelength of 460 nm or more, and a transmittance of 50% or more was obtained as shown in

TABLE 2

|  | Example 6 | Example 7 | Example 8 | Example 9 | Example 10 |
|---|---|---|---|---|---|
| Zn(at %) | 45.5 | 49.2 | 48 | 43 | 37 |
| Se(at %) | 50 | 60 | 50 | 50 | 50 |
| Cu(at %) | 4.5 | 0.8 | 2 | 7 | 13 |
| Total(at %) | 100 | 100 | 100 | 100 | 100 |
| α | 0.09 | 0.016 | 0.04 | 0.14 | 0.26 |
| β | 0 | 0 | 0 | 0 | 0 |
| γ | 0 | 0 | 0 | 0 | 0 |
| x | 1 | 1 | 1 | 1 | 1 |
| y | 0 | 0 | 0 | 0 | 0 |
| Resistivity(Ω cm) | 0.02 | 5 | 0.2 | 0.02 | 0.0015 |
| Carrier Concentration (cm − 3) | 5.00E+19 | 9.00E+18 | 6.00E+19 | 6.50E+19 | 5.00E+20 |

Examples 11 to 15

Next, description will be given to examples 11 to 15 according to the invention.

Figure 9:
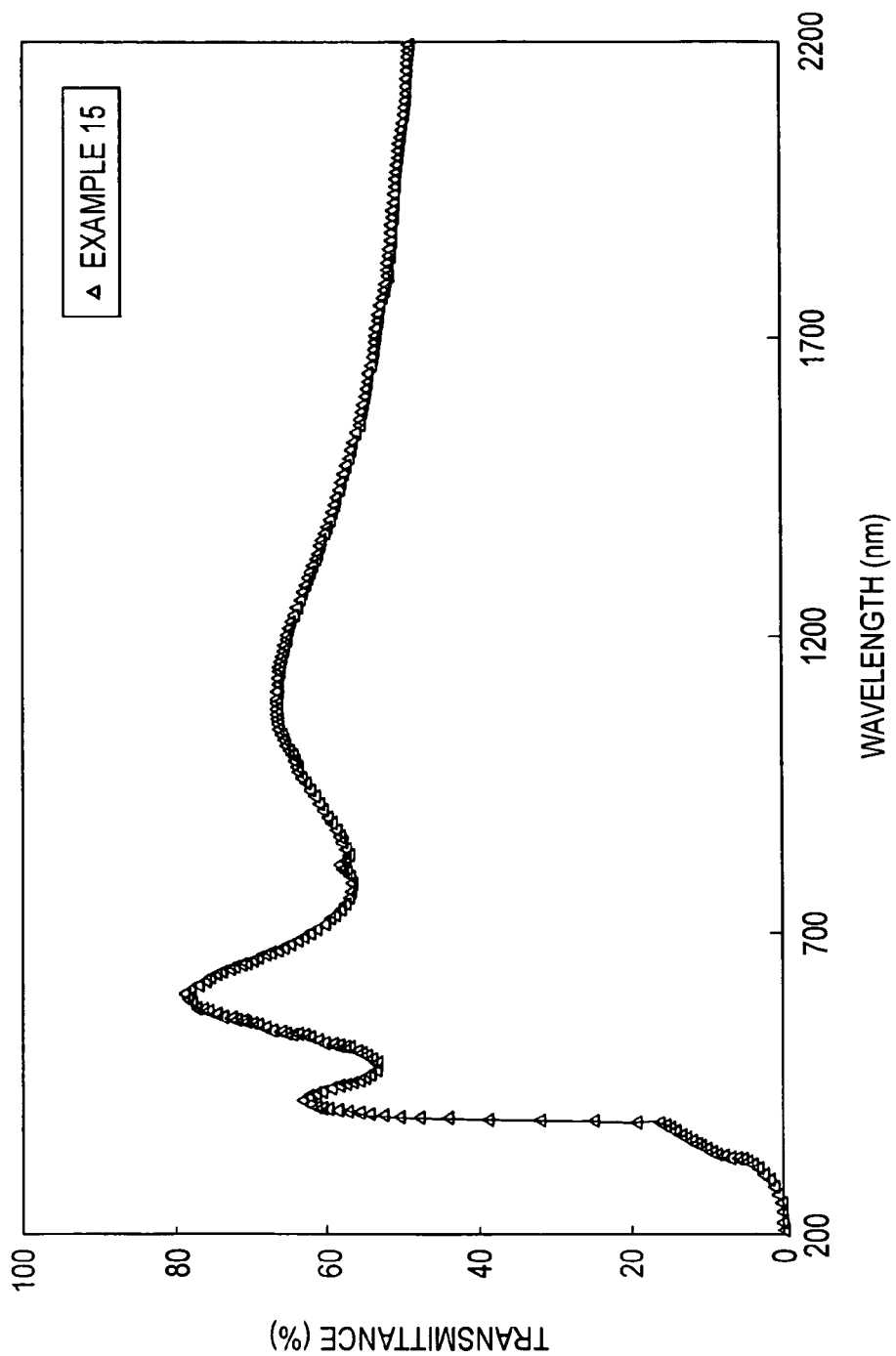
FIG. 9 is a chart showing a transmission spectrum of the semiconductor material according to an example 15 of the invention.

A film was formed in the same manner as that in the example 6 except that high purity S (a purity of 99.9999%) was used as an S raw material and was supplied from an evaporation source having a cracking cell, and S was further doped. The temperatures of S and Se raw materials were set to be 80 to 110° C. and 125 to 150° C., respectively. It was FIG. 9. More specifically, an absorption coefficient in this wavelength region is estimated to be $3 \times 10^4$ cm$^{-1}$ at a maximum. Furthermore, it was confirmed that a transmittance within a wavelength range of 460 nm or less is higher than that in an example in which S is not included. According to an SEM observation, these films were polycrystals having particle sizes of 1 to 5 μm. Two films for each of Au, Al and ITO were formed on the film by sputtering, and a current-voltage characteristic between electrodes was confirmed. Consequently, it was found that an ohmic contact is formed in any case.

TABLE 3

|  | Example 11 | Example 12 | Example 13 | Example 14 | Example 15 |
|---|---|---|---|---|---|
| Zn(at %) | 45.5 | 45.8 | 45.2 | 43.7 | 43 |
| S(at %) | 20 | 30 | 50 | 45 | 25 |
| Se(at %) | 30 | 20 | 0 | 5 | 25 |
| Cu(at %) | 4.5 | 4.2 | 4.8 | 6.3 | 7 |
| Total(at %) | 100 | 100 | 100 | 100 | 100 |
| α | 0.09 | 0.084 | 0.096 | 0.126 | 0.14 |
| β | 0 | 0 | 0 | 0 | 0 |
| γ | 0 | 0 | 0 | 0 | 0 |
| x | 0.6 | 0.4 | 0 | 0.1 | 0.5 |
| y | 0 | 0 | 0 | 0 | 0 |
| Resistivity(Ω cm) | 0.05 | 0.12 | 5 | 2 | 0.3 |
| Carrier Concentration (cm − 3) | 5.00E+19 | 2.20E+19 | 1.00E+19 | 1.00E+19 | 1.30E+19 |

Examples 16 to 21

Next, description will be given to examples 16 to 21 according to the invention.

A film was formed in the same manner as that in the example 1 except that Mg, Cd and Te were further doped to an evaporating raw material. The temperatures of the raw materials of Mg, Cd and Te were set to be 500 to 600° C., 550 to 675° C., and 260 to 310° C. By an observation carried out through an XRD method, it was found that all of the films thus obtained are of a zincblende type having a (111) orientation. According to an SEM observation, these films were polycrystals having particles sizes of 1 to 5 μm. Moreover, it was confirmed that the films are p-type semiconductors by the Seebeck effect electromotive force. By an ICP analysis, it was confirmed that a composition shown in Table 4 is set. For example, in the example 16, Zn, Mg, Se and Cu were 42.5 at %, 5 at %, 50.0 at %, and 2.5 at %, respectively. In the case in which this is expressed in a composition formula of $Zn_{(1-\alpha-\beta-\gamma)}Cu_\alpha A_\beta B_\gamma S_{(1-x-y)}Se_x Te_y$, $\alpha=0.05$, $\beta=0.1$, $\gamma=0$, $x=0$ and $y=0$ are obtained. Compositions in other examples are also shown in the Table in the same manner. Moreover, it was found that the films have a low resistivity of 1 Ωcm or less.

A transparent property was observed. As a result, a remarkable absorption could not be seen in at least 2.2 μm with a wavelength of 460 nm or more, and a transmittance of 20% or more was obtained. An absorption coefficient in this wavelength region is estimated to be $6\times10$ cm$^{-1}$ at a maximum. Two films for each of Au, Al and ITO were formed on the film by sputtering, and a current-voltage characteristic between electrodes was confirmed. Consequently, it was found that an ohmic contact is formed in any case.

a film having a desirable composition. Each of the raw materials of Al, Ga, In and ZnCl$_2$ is doped in a very small amount. Therefore, a precise temperature control (a temperature deviation ±0.5%, a PID control) was carried out. According to an ICP analysis, each of the concentrations of Zn, Cu and Se was the same as that in the example 1. According to an SIMS analysis, the concentrations of Al, Ga, In and Cl were $8\times10^{19}$ cm$^{-3}$, $3.5\times10^{19}$ cm$^{-3}$, $5\times10^{19}$ cm$^{-3}$ and $9\times10^{19}$ cm$^{-3}$, respectively. According to an XRD observation, the same diffraction line as zincblende type ZnSe having a (111) orientation was obtained. According to an SEM observation, moreover, all of these films were polycrystals having particle sizes of 1 to 5 μm. By the Seebeck effect electromotive force, it was confirmed that all of these films are p-type semiconductors. These resistivities were 250 Ωcm, 27 Ωcm, 38 Ωcm and 920 Ωcm, respectively. In these films, a remarkable absorption could not be seen in at least 2.2 μm with a wavelength of 460 nm or more, and a transmittance of 20% or more was obtained. More specifically, an absorption coefficient in this wavelength region is estimated to be $6\times10^4$ cm$^{-1}$ at a maximum. Two films for each of Au, Al and ITO were formed on the film by sputtering, and a current-voltage characteristic between electrodes was confirmed. Consequently, it was found that an ohmic contact is formed in any case.

Example 26

Next, description will be given to an example 26 according to the invention.

An n-type ZnSe substrate (Ga doped, a volume resistivity which is equal to or lower than $10^{-1}$ Ωcm, surface orientation (111)) was used to form N-doped p-ZnSe (a carrier concen-

TABLE 4

| | Example 16 | Example 17 | Example 18 | Example 19 | Example 20 | Example 21 |
|---|---|---|---|---|---|---|
| Zn(at %) | 42.5 | 37 | 40.2 | 36.5 | 45.5 | 45 |
| Mg(at %) | 5 | 8 | | | | |
| Cd(at %) | | | 5 | 9 | | |
| Cu(at %) | 2.5 | 5 | 4.8 | 4.5 | 4.5 | 5 |
| Se(at %) | 50 | 50 | 50 | 50 | 45 | 41.5 |
| Te(at %) | | | | | 5 | 8.5 |
| Total(at %) | 100 | 100 | 100 | 100 | 100 | 100 |
| α | 0.05 | 0.1 | 0.096 | 0.09 | 0.09 | 0.1 |
| β | 0.1 | 0.16 | 0 | 0 | 0 | 0 |
| γ | 0 | 0 | 0.1 | 0.18 | 0 | 0 |
| x | 0 | 0 | 0 | 0 | 0 | 0 |
| y | 0 | 0 | 0 | 0 | 0.1 | 0.17 |
| Resistivity(Ω cm) | 0.32 | 0.65 | 0.15 | 0.25 | 0.08 | 0.052 |
| Carrier Concentration (cm − 3) | 3.20E+19 | 1.20E+19 | 2.00E+19 | 4.20E+19 | 2.50E+20 | 6.00E+20 |

Examples 22 to 25

Next, description will be given to examples 22 to 25 according to the invention.

Figure 10:
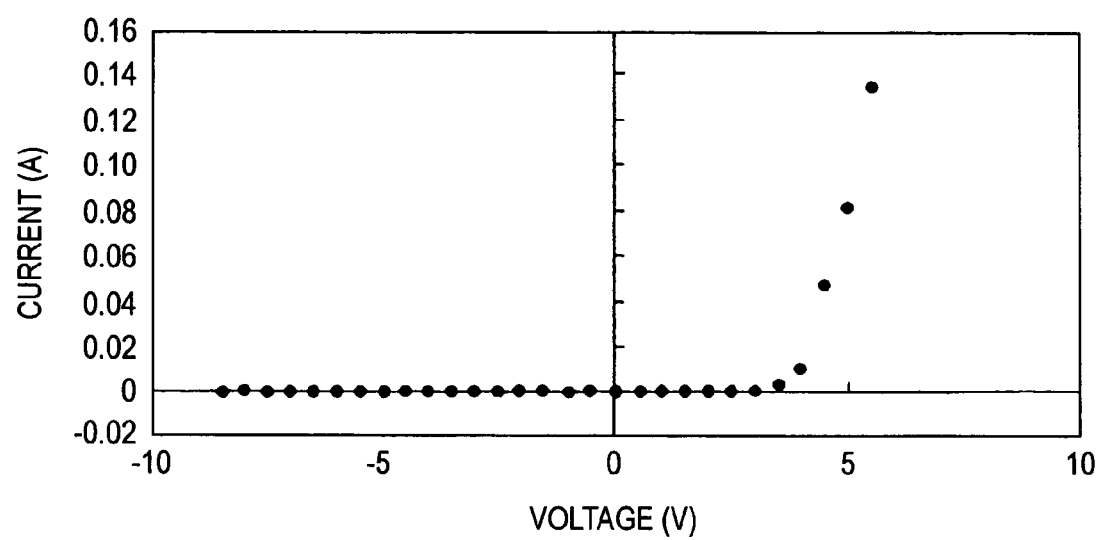
FIG. 10 is a chart showing a voltage-current curve of a semiconductor light emitting device according to an example 26 of the invention.
Figure 11:
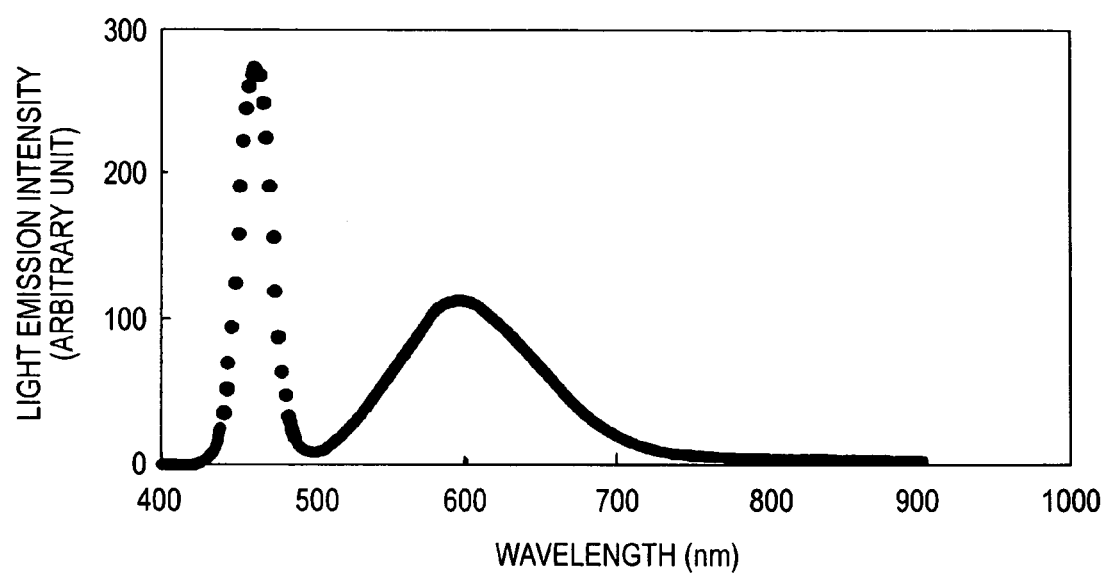
FIG. 11 is a chart showing an EL spectrum of the semiconductor light emitting device according to the example 26 of the invention.
Figure 12:
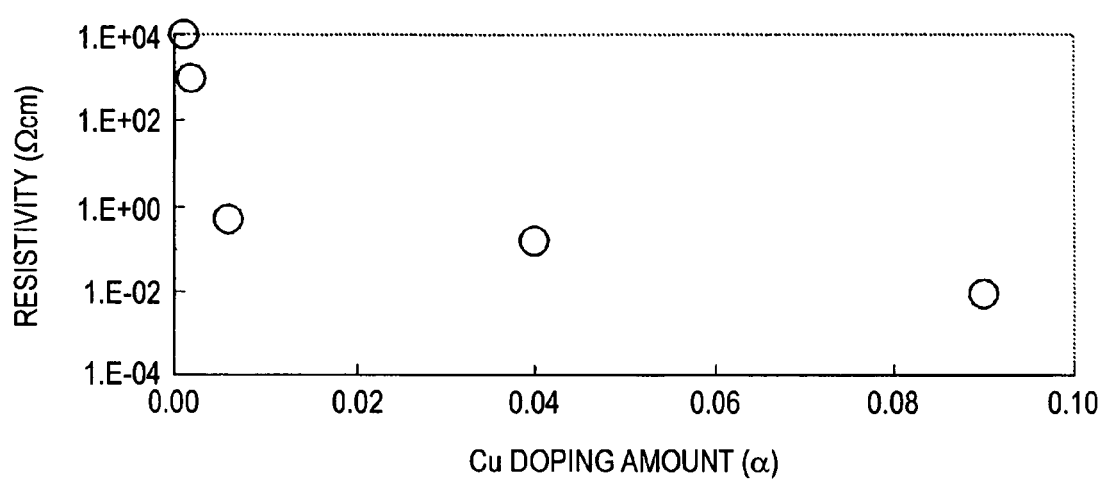
FIG. 12 is a chart showing a volume resistivity with respect to a Cu doping amount of a Cu doped ZnS based semiconductor material according to the invention.

A film was formed in the same manner as that in the example 1 except that Al, Ga, In and Cl were doped in addition to Cu respectively. For the dopant of Al, Ga and In, each of high purity materials (a purity of 99.9999%) of Al, Ga and In was utilized as an evaporation source (the temperatures of raw materials were 650° C., 600° C. and 575° C., respectively). ZnCl$_2$ (a purity of 99.999%) was used as a Cl adding raw material and a holding temperature thereof was set to be 320° C. In addition to Zn, Se and Cu, these raw materials were evaporated on a substrate at the same time, thereby depositing tration of $2\times10^{17}$ cm$^{-3}$) in a thickness of approximately 1 μm on the substrate by an MBE method. In the same manner as in the first example, Cu doped ZnSe was formed on the film by an evaporation and was subjected to post annealing. Furthermore, an Au electrode having a diameter of 1 mm was attached in a thickness of approximately 100 nm to this film by a vacuum evaporation method. An In electrode was attached to the n-ZnSe substrate by means of an ultrasonic solder, and a current-voltage characteristic between the Au electrode and the In electrode was observed. There was obtained a rectifying property in which a current rises at a forward bias voltage of approximately 3V or more (the Au electrode is set to be a positive electrode) as shown in FIG. 10. When a higher voltage than the threshold voltage was applied, moreover, there was obtained a light emission having a peak wavelength of 465 nm and a light emission having a broad spectrum in a peak wavelength of 600 nm as shown in FIG. 11. It can be supposed that a light emission of 465 nm is based on a recombination of a hole—an electron on a pn junction interface and a light emission of 600 nm is a fluorescence of a substrate crystal which is optically pumped by the light emission of 465 nm.

The device was driven for 1000 hours by a low current operation of 20 mA. Consequently, a decrease in a light emission intensity from an initial intensity was not observed and it was confirmed that a stable operation can be obtained for a long time.

Example 27

Next, description will be given to an example 27 according to the invention.

An n-type ZnSe substrate (Ga doped, a volume resistivity which is equal to or lower than $10^{-1}$ Ωcm, surface orientation (111)) was used as a substrate to form nondoped ZnSe in a thickness of approximately 50 nm on the substrate by an MBE method. In the same manner as in the first example, Cu doped ZnSe was formed on the film by an evaporation and was subjected to post annealing. Furthermore, an Au electrode having a diameter of 1 mm was attached in a thickness of approximately 100 nm to this film by a vacuum evaporation method. Consequently, a pn junction having a thin i-layer inserted therein is formed by the n-ZnSe substrate and p-type ZnSe. An In electrode was attached to the n-type ZnSe substrate by means of an ultrasonic solder, and a current-voltage characteristic between the Au electrode and the In electrode was observed. Consequently, there was obtained a rectifying property in which a current rises at a forward bias voltage of approximately 3V or more (the Au electrode is set to be a positive electrode) in the same manner as shown in FIG. 10. When a higher voltage than the threshold voltage was applied, moreover, there was obtained a light emission having the same spectrum as that in FIG. 11. Furthermore, the device was driven for 1000 hours by a low current operation of 20 mA. Consequently, a decrease in a light emission intensity from an initial intensity was not observed and it was confirmed that a stable operation can be obtained for a long time.

Example 28

Next, description will be given to an example 28 according to the invention.

A film of Cu doped ZnSe was formed in a thickness of 0.2 μm by an evaporation in the same manner as in the example 6 except that the temperature of a substrate in the formation of a film was set to be 125° C. and post annealing using a lamp heating furnace was not carried out. By an observation using an XRD method, only a broad halo pattern having no diffraction peak was obtained. For this reason, it was found that this film is a thin film formed by a microcrystal (a particle size of 2 to 3 nm or less) or an amorphous thin film from which a diffraction cannot be obtained by this method. Moreover, it was confirmed that a granular substance or a grain boundary cannot be observed from the film by the SEM observation, and the film is the amorphous thin film. Furthermore, a transmittance was measured. Consequently, a remarkable absorption could not be observed in at least 2.2 μm with a longer wavelength than 460 nm, and a transmittance of 20% or more was obtained. More specifically, an absorption coefficient in this wavelength region is estimated to be $8 \times 10^4$ cm$^{-1}$ at a maximum. By a four probe method, it was found that this film has a resistivity of 4 Ωcm. By the Seebeck effect electromotive force, moreover, it was found that this film has a p-type conductivity. According to an ICP analysis, furthermore, the concentrations of Zn, Se and Cu were 44.0 at %, 5.0 at % and 51.0 at %, respectively. From the Hall measurement, moreover, it was found that a mobility has a value of approximately 0.05 cm$^2$/(Vsec) and a carrier concentration has a value of approximately $10^{19}$ cm$^{-3}$.

Example 30

A polycrystalline n-type ZnSe substrate (Ga doped, a volume resistivity which is equal to or lower than 2 Ωcm) was prepared as a substrate.

This is obtained by carrying out a (Zn+Ga) melting bath dipping treatment (Ga/Zn=0.15 (mole ratio), 950° C.—50 hours) to be an n-type resistance reducing treatment which has conventionally been known in relation to a ZnS based semiconductor material over a polycrystalline ZnSe substrate (manufactured by ICL Co., Ltd. in U.S.A.) fabricated by a CVD method and then polishing the surface. A film of Cu doped ZnSe was formed on the substrate by an evaporation in the same manner as in the example 1 and was subjected to post annealing. By an SEM observation, it was found that the film thus obtained is a polycrystal having a particle size of approximately 1 to 2 μm. An Al electrode having a diameter of 1 mm was attached in a thickness of approximately 50 nm onto the film by a vacuum evaporation method. In was attached to the n-type ZnSe substrate by means of an ultrasonic solder, and furthermore, a heat treatment was carried out in the nitrogen atmosphere at 350° C. for 5 minutes. Thus, an In electrode was formed. A current-voltage characteristic between the Al electrode and the In electrode was observed. Consequently, there was obtained a rectifying property in which a current rises at a forward bias voltage of approximately 3.5 V or more (the Al electrode is set to be a positive electrode). Thus, it was confirmed that the device functions as a diode.

INDUSTRIAL APPLICABILITY

As described above, the semiconductor material according to the invention can be utilized as a low resistance p-type semiconductor material having a transparent property for a ZnS based material. Moreover, the semiconductor material can be utilized in a semiconductor device using the same. Furthermore, it is possible to utilize the semiconductor material in various semiconductor devices including a light emitting device having a high efficiency and a long lifetime which use the same.

The invention claimed is:

1. A p-type semiconductor material expressed in a composition formula of $Zn_{(1-\alpha-\beta-\gamma)}Cu_\alpha A_\beta B_\gamma S_{(1-x-y)}Se_x Te_y$, (0.004≦α≦0.4, β≦0.2, γ≦0.2, 0≦x≦1, 0≦y≦0.2, and x+y≦1, A and B are elements selected from Cd, Hg and alkaline earth metals),
wherein a total amount of atoms (Zn, Cu, A, B) is equal to a total amount of atoms (S, Se, Te)).

2. The p-type semiconductor material according to claim 1, wherein the A is Mg.

3. The p-type semiconductor material according to claim 1, wherein the B is Cd.

4. The p-type semiconductor material according to claim 2, wherein the B is Cd.

5. The p-type semiconductor material according to claim 1, wherein the semiconductor material contains at least one dopant selected from Cl, Br, I, Al, Ga and In as a compensation dopant and a concentration of the compensation dopant is $10^{17}$ to $10^{20}$ cm$^{-3}$.

6. The p-type semiconductor material according to claim 1, wherein the semiconductor material has a light absorption coefficient of $5\times10^5$ cm$^{-1}$ or less at 470 nm to 750 nm.

7. The p-type semiconductor material according to claim 1, wherein a volume resistivity of the semiconductor material is equal to or higher than $10^{-4}$ Ωcm and is lower than $10^3$ Ωcm.

8. The p-type semiconductor material according to claim 1, wherein a carrier concentration of the semiconductor material is equal to or higher than $10^{16}$ cm$^{-3}$ and is lower than $10^{22}$ cm$^{-3}$.

9. A semiconductor device in which the p-type semiconductor material according to claim 1, constitutes a hole injecting electrode layer in an amorphous phase or a polycrystalline phase.

10. The semiconductor device according to claim 9, wherein the semiconductor device is a light emitting device.

11. The p-type semiconductor material according to claim 2, wherein the semiconductor material contains at least one dopant selected from Cl, Br, I, Al, Ga and In as a compensation dopant and a concentration of the compensation dopant is $10^{17}$ to $10^{20}$ cm$^{-3}$.

12. The p-type semiconductor material according to claim 3, wherein the semiconductor material contains at least one dopant selected from Cl, Br, I, Al, Ga and In as a compensation dopant and a concentration of the compensation dopant is $10^{17}$ to $10^{20}$ cm$^{-3}$.

13. The p-type semiconductor material according to claim 4, wherein the semiconductor material contains at least one dopant selected from Cl, Br, I, Al, Ga and In as a compensation dopant and a concentration of the compensation dopant is $10^{17}$ to $10^{20}$ cm$^{-3}$.

14. The p-type semiconductor material according to claim 2, wherein the semiconductor material has a light absorption coefficient of $5\times10^5$ cm$^{-1}$ or less at 470 nm to 750 nm.

15. The p-type semiconductor material according to claim 3, wherein the semiconductor material has a light absorption coefficient of $5\times10^5$ cm$^{-1}$ or less at 470 nm to 750 nm.

16. The p-type semiconductor material according to claim 4, wherein the semiconductor material has a light absorption coefficient of $5\times10^5$ cm$^{-1}$ or less at 470 nm to 750 nm.

17. The p-type semiconductor material according to claim 2, wherein a volume resistivity of the semiconductor material is equal to or higher than $10^{-4}$ Ωcm and is lower than $10^3$ Ωcm.

18. The p-type semiconductor material according to claim 3, wherein a volume resistivity of the semiconductor material is equal to or higher than $10^{-4}$ Ωcm and is lower than $10^3$ Ωcm.

19. The p-type semiconductor material according to claim 4, wherein a volume resistivity of the semiconductor material is equal to or higher than $10^{-4}$ Ωcm and is lower than $10^3$ Ωcm.

20. The p-type semiconductor material according to claim 2, wherein a carrier concentration of the semiconductor material is equal to or higher than $10^{16}$ cm and is lower than $10^{22}$ cm$^{-3}$.

21. The p-type semiconductor material according to claim 3, wherein a carrier concentration of the semiconductor material is equal to or higher than $10^{16}$ cm$^{-3}$ and is lower than $10^{22}$ cm$^{-3}$.

22. The p-type semiconductor material according to claim 4, wherein a carrier concentration of the semiconductor material is equal to or higher than $10^{16}$ cm$^{-3}$ and is lower than $10^{22}$ cm$^{-3}$.

23. A semiconductor device in which the p-type semiconductor material according to claim 2, constitutes a hole injecting electrode layer in an amorphous phase or a polycrystalline phase.

24. A semiconductor device in which the p-type semiconductor material according to claim 3, constitutes a hole injecting electrode layer in an amorphous phase or a polycrystalline phase.

25. A semiconductor device in which the p-type semiconductor material according to claim 4, constitutes a hole injecting electrode layer in an amorphous phase or a polycrystalline phase.

26. The semiconductor device according to claim 23, wherein the semiconductor device is a light emitting device.

27. The semiconductor device according to claim 24, wherein the semiconductor device is a light emitting device.

28. The semiconductor device according to claim 25, wherein the semiconductor device is a light emitting device.

* * * * *